(12) United States Patent
Martin et al.

(10) Patent No.: US 8,384,269 B2
(45) Date of Patent: Feb. 26, 2013

(54) ELECTROSTATIC BONDING OF A DIE SUBSTRATE TO A PACKAGE SUBSTRATE

(75) Inventors: David Martin, Fort Collins, CO (US); John Choy, Westminster, CO (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 78 days.

(21) Appl. No.: 12/908,047

(22) Filed: Oct. 20, 2010

(65) Prior Publication Data

US 2012/0098625 A1 Apr. 26, 2012

(51) Int. Cl.
*H03H 9/15* (2006.01)
(52) U.S. Cl. ............ 310/324; 310/313 A; 310/348; 310/309
(58) Field of Classification Search ............ 310/324, 310/313 A, 348, 309
See application file for complete search history.

(56) References Cited

U.S. PATENT DOCUMENTS

| | | |
|---|---|---|
| 5,587,620 A | 12/1996 | Ruby et al. |
| 5,873,153 A | 2/1999 | Ruby et al. |
| 6,060,818 A | 5/2000 | Ruby et al. |
| 6,384,697 B1 | 5/2002 | Ruby |
| 6,529,362 B2 | 3/2003 | Herchen |
| 6,828,713 B2 | 12/2004 | Bradley et al. |
| 7,002,282 B2 * | 2/2006 | Mishima ............... 310/313 R |
| 7,275,292 B2 | 10/2007 | Ruby et al. |
| 7,405,637 B1 | 7/2008 | Mehta et al. |
| 7,489,593 B2 * | 2/2009 | Nguyen-Dinh et al. ...... 367/181 |
| 7,626,681 B2 | 12/2009 | Sutedja et al. |
| 2002/0171133 A1 * | 11/2002 | Mok et al. ............... 257/678 |
| 2003/0107456 A1 * | 6/2003 | Nishihara et al. ............ 333/187 |
| 2005/0189622 A1 * | 9/2005 | Humpston et al. ........... 257/659 |
| 2006/0103492 A1 | 5/2006 | Feng et al. |
| 2007/0205850 A1 | 9/2007 | Jamneala et al. |
| 2008/0013405 A1 * | 1/2008 | Moon et al. ............... 367/92 |
| 2008/0122317 A1 * | 5/2008 | Fazzio et al. .............. 310/328 |
| 2008/0122320 A1 | 5/2008 | Fazzio et al. |
| 2008/0123876 A1 | 5/2008 | Sato et al. |
| 2008/0258842 A1 * | 10/2008 | Ruby et al. ............... 333/187 |

FOREIGN PATENT DOCUMENTS

JP 62021276 1/1987

* cited by examiner

*Primary Examiner* — Walter Benson
*Assistant Examiner* — Bryan Gordon

(57) ABSTRACT

A transducer apparatus comprises a package substrate and a transducer disposed over a die substrate. The die substrate is disposed over the package substrate. The transducer apparatus also comprises a voltage source connected between the die substrate and the package substrate, and configured to selectively apply an electrostatic attractive force between the die substrate and the package substrate.

9 Claims, 5 Drawing Sheets

ELECTROSTATIC BONDING OF A DIE SUBSTRATE TO A PACKAGE SUBSTRATE

BACKGROUND

Transducers generally convert electrical signals to mechanical signals or vibrations, and/or mechanical signals or vibrations to electrical signals. Acoustic transducers in particular convert electrical signals to acoustic signals (sound waves) in a transmit mode (e.g., a speaker application), and/or convert received acoustic waves to electrical signals in a receive mode (e.g., a microphone application). The functional relationship between the electrical and acoustic signals of an acoustic transducer depends, in part, on the transducer's operating parameters, such as natural or resonant frequency, acoustic receive sensitivity, acoustic transmit output power and the like.

Transducers, such as ultrasonic transducers, are provided in a wide variety of electronic applications, including filters. As the need to reduce the size of many components continues, the demand for reduced-size transducers continues to increase, as well. This has lead to comparatively small transducers, which may be micromachined according to various technologies, such as micro-electromechanical systems (MEMS) technology.

Various types of MEMS transducers, such as piezoelectric micro-electromechanical ultrasonic transducers (PMUTs), include a resonator stack, having a layer of piezoelectric material between two conductive plates (electrodes), formed on a thin membrane. To provide stable and predictable operation, the membrane is typically designed to have a net tensile stress. The operating characteristics of the resonator stack such as the operating frequency and amplitude are dependent on the tensile stress and in-plane stress.

MEMS transducers typically comprise the membrane provided over a die substrate. The die substrate is then provided on a substrate package using an adhesive material such as known epoxy or similar resin. The die substrate is thereby bonded to the package substrate, which may be provided in further packaging. When the epoxy cures shrinkage can occur. This shrinkage can impart additional stress on the die substrate and ultimately to the membrane of the MEMS transducer. Because the operating characteristics of the MEMS transducer are impacted by the stress on the membrane, the operating characteristics of the MEMS transducer can change, and in an unpredictable manner.

Additionally, during operation, the transducer package is subject to changes in temperature from both the environment and from the operation of the MEMS transducer itself. These changes in temperature can cause expansion and/or contraction of both the die substrate and the package substrate. Because of differences in the thermal expansion coefficients of the materials used for the die substrate and the package substrate, the die substrate and package substrate contract and/or expand unequally and, possibly unevenly. As such, additional stress can be imparted on the die substrate and ultimately on the membrane of the MEMS transducer due to temperature variations. Again, because the operating characteristics of the MEMS transducer are impacted by the stress on the membrane, the operating characteristics of the MEMS transducer can change, and in an unpredictable manner.

SUMMARY

In a representative embodiment, a transducer apparatus comprises a package substrate; and a transducer disposed over a die substrate. The die substrate is disposed over the package substrate. The transducer apparatus also comprises a voltage source connected between the die substrate and the package substrate, and configured to selectively apply an electrostatic attractive force between the die substrate and the package substrate.

In another representative embodiment, a transducer package comprises a transducer disposed over a die substrate; a first electrode disposed over the die substrate; a package substrate; and a second electrode disposed over the package substrate.

BRIEF DESCRIPTION OF THE DRAWINGS

The representative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
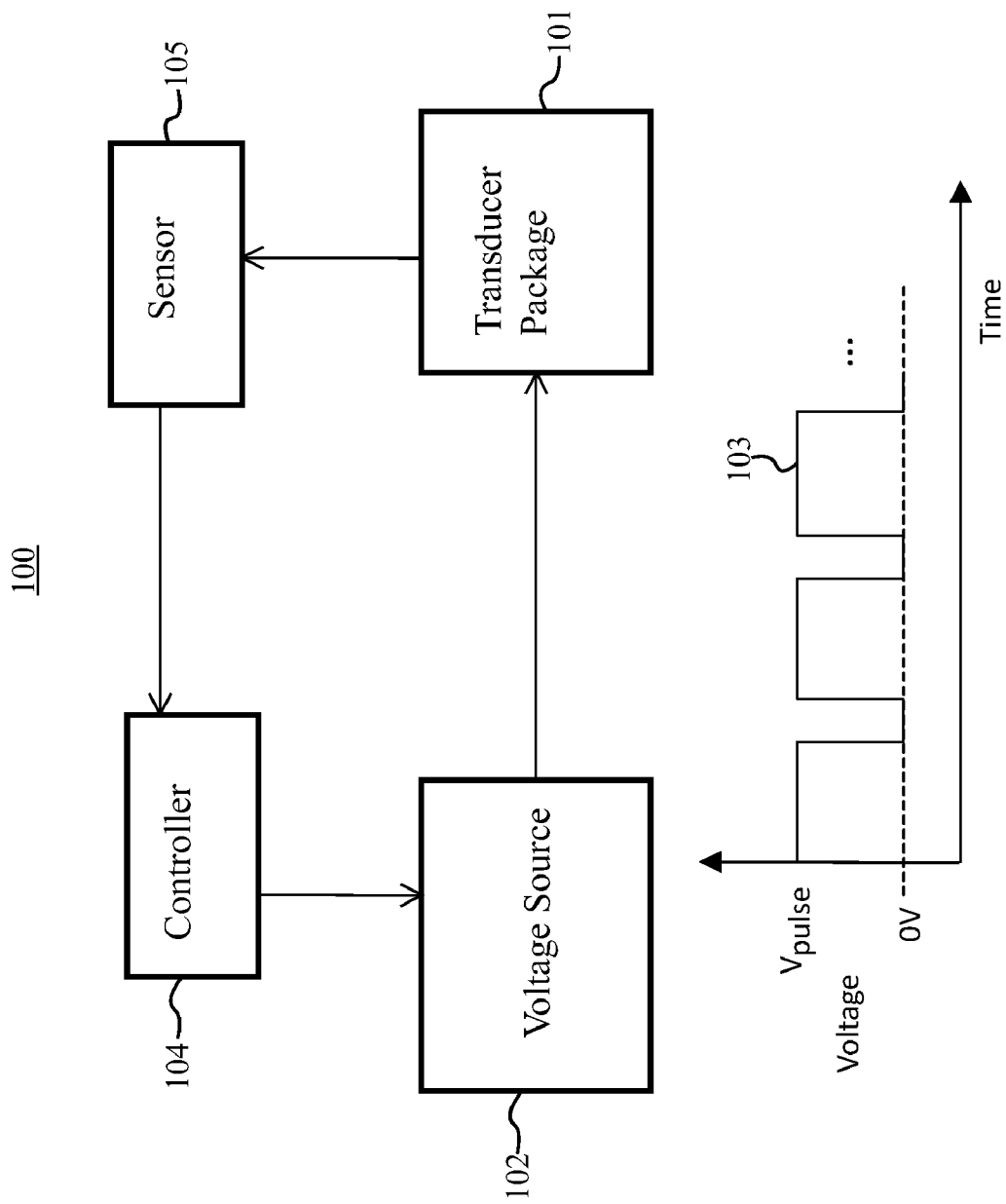
FIG. 1 is a simplified block diagram illustrating a transducer apparatus, according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper," "lower," "left," "right," "vertical" and "horizontal," are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be "below" that element. Likewise, if the device were rotated 90 degrees with respect to the view in the drawings, an element described as "vertical," for example, would now be "horizontal."

A transducer apparatus and transducer packages are described below in connection with representative embodiments. The present teachings contemplate a plurality of transducers provided over a package substrate in an array, for example. The transducers of the representative embodiments are illustratively micro-electromechanical systems (MEMS) transducer, such as piezoelectric micro-electromechanical ultrasonic transducers (PMUTs). It is emphasized that MEMS transducers and PMUTs are merely illustrative, and that other types of transducers are contemplated by the present teachings. Furthermore, as used herein "a" or "an" means one or more. For example, the term "a transducer" means "one or more transducers."

FIG. 1 is a simplified block diagram illustrating a transducer apparatus 100 in accordance with a representative embodiment. The transducer apparatus 100 comprises a transducer package 101. The transducer package 101 comprises a transducer comprising a die substrate and a package substrate. The transducer, die substrate and package substrate are not shown in FIG. 1. However, transducers comprising die substrates, and package substrates are described in connection with illustrative embodiments shown in FIGS. 2-5 below.

A voltage source 102 is connected to the transducer package 101. It is contemplated that the voltage source 102 is a component of the transducer package 101 or other package comprising the transducer package 101, or a separate device selectively connected to the transducer package 101 as depicted in FIG. 1. The voltage source 102 is configured to selectively apply a voltage to the transducer package 101 and as such to selectively apply an electrostatic attractive force between the die substrate and the package substrate. As described more fully below, the selective application of the electrostatic force between the die substrate and the package substrate provides the selective bonding of the die substrate to the package substrate.

In certain embodiments the voltage source 102 is configured to apply a substantially constant (e.g., DC) voltage between the die substrate and the package substrate. This results in the application of a substantially constant attractive electrostatic attractive force that bonds the die substrate and the package substrate together. In other embodiments, the voltage may be time dependent, such as voltage 103, which is illustratively a square-wave or pulse voltage having a "high" voltage of $V_{pulse}$ and a "low" voltage of 0 volts. It is noted that the low voltage is not necessarily 0 Volts. Rather, the voltage is selected to provide a suitable voltage difference between the "high" voltage and the "low" voltage. Application of a time-dependent voltage results the application of a time-dependent attractive electrostatic force between the die substrate and the package substrate: when the voltage (e.g., $V_{pulse}$) is applied, the die substrate and the package substrate are bonded together, and when no voltage is applied no electrostatic force is applied between the die substrate and the package substrate. As described more fully below, in certain applications the time dependent voltage may be periodic, and in other applications the time dependent voltage may be non-periodic.

In certain embodiments the transducer apparatus 100 comprises a controller 104. The controller 104 is configured to provide an input signal to the voltage source 102. Based on the input signal, the voltage source 102 applies a voltage to the transducer package 101, resulting in the selective application of an attractive electrostatic force between the die substrate and the package substrate. The input signal from the controller 104 may result in a DC voltage, a periodic voltage, or a non-periodic voltage from the voltage source 102.

The controller 104 illustratively comprises a processor (not shown) and memory (not shown) useful in providing the input signal to the voltage source 102. Generally, the processor comprises a central processing unit (CPU) that can execute computer programs loaded therein. The processor may be a microprocessor, a programmable logic device (PLD) such as a field programmable gate array (FPGA) instantiated with necessary cores to effect the certain calculations. Moreover, the controller 104 is configured to sample a sensor(s), such as described below. Based on the sampled values, logic in the controller 104 is adapted to determine an output voltage from the voltage source 102.

In certain embodiments, the transducer apparatus 100 comprises a sensor 105. As described more fully below, the sensor 105 comprises one or more devices that measure certain operational characteristics of the transducer package 101 including operating frequency, temperature within the transducer package 101 and strain across the membrane of the transducer. The sensor 105 provides the measurement data to the controller 104, which selectively adjusts the voltage from the voltage source 102. For example, if the operating frequency is outside of a prescribed frequency range, stress at the transducer may be the cause. The measured signal from the sensor 105 is provided to the controller 104. Based on the measured data and a comparison to the prescribed frequency range (e.g., stored in memory), the controller 104 provides an input signal to the voltage source 102 that momentarily sets the output from the voltage source to a low voltage (e.g., 0 Volts). The application of the low voltage results in cessation of the attractive electrostatic force between the die substrate and the package substrate, relaxing the stress due to external factors (e.g., temperature). After the momentary application of the low voltage, the controller 104 would provide an input signal to the voltage source 102 resulting in an output of a suitable high voltage by the voltage source 102 and the resumption of the electrostatic attractive force that bonds the die substrate to the package substrate.

Figure 2:
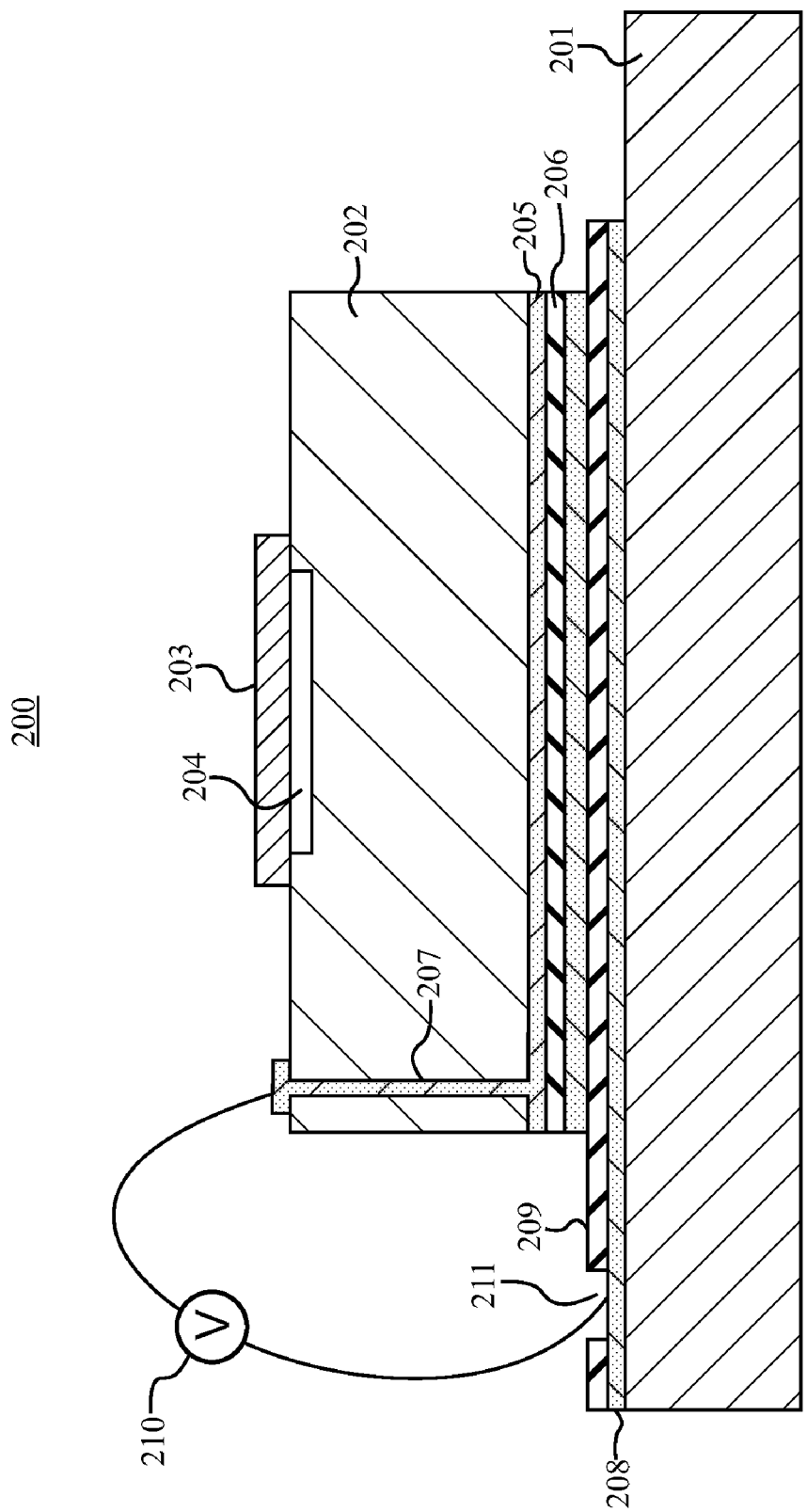
FIG. 2 is a cross-sectional diagram illustrating a transducer package, according to a representative embodiment.

FIG. 2 is a cross-sectional diagram illustrating a transducer package 200 in accordance with a representative embodiment. The transducer package 200 may be implemented in the transducer apparatus 100 described above. The transducer package 200 comprises a package substrate 201 with a die substrate 202 disposed thereover. Illustratively, the package substrate 201 may comprise a plastic material suitable for the intended application of the transducer package 200, alumina or a printed circuit board (e.g., FR4). Alternatively, the package substrate 201 comprises a semiconductor material, such as such as silicon (Si), silicon germanium (SiGe), a Group III-V semiconductor (e.g., gallium arsenide (GaAs) or indium phosphide (InP), or variants thereof). The die substrate 202 comprises a semiconductor material, such as such as silicon (Si), silicon germanium (SiGe), a Group III-V semiconductor (e.g., gallium arsenide (GaAs) or indium phosphide (InP), or variants thereof). It is contemplated that the same semiconductor material is used for both the package substrate 201 and the die substrate 202 to provide, for example, materials having the same coefficient of thermal expansion.

A transducer 203 comprising membrane (not shown) and a resonator stack (not shown) is disposed over a cavity 204. The resonator stack comprises a first electrode (not shown), a piezoelectric layer (not shown) disposed over the first electrode, and a second electrode (not shown) disposed over the piezoelectric layer. Fabrication methods, materials and structures of the transducer 203 may be as described by RUBY et al. in U.S. Pat. Nos, 5,587,620, 5,873,153, 6,060,818, 6,384,697 and 7,275,292; by BRADLEY et al. in U.S. Pat. No. 6,828, 713; by FAZZIO et al. in U.S. Pat. Nos. 7,579,753 and 7,538, 477; by JAMNEALA et al. in U.S. Patent Application Pub. No. 2007/0205850; by RUBY et al. in U.S. Pat. No. 7,714, 684; by FENG et al. in U.S. Pat. No. 7,280,007; and by MARTIN et al. in U.S. patent application Ser. No. 12/495,443; all of which are hereby incorporated by reference. Notably, the teachings of these patents and patent applications are intended to be illustrative of methods, materials and structures useful to the present teachings, but in no way limiting to the present teachings.

The die substrate 202 comprises a first electrode 205. The first electrode 205 is illustratively provided over a lower surface of the die substrate 202 with a first electrically insulating layer ("first insulating layer") 206 disposed thereover. The first electrode 205 is a suitable electrical conductor such as a suitable metal or metal alloy and the first insulating layer 206 may be a deposited oxide (e.g., $SiO_2$) layer provided thereover by a known deposition method.

A conductive via ("via") 207 electrically contacts the first electrode 205 and extends through the die substrate 202 to an upper surface thereof. The via 207 may be formed by etching an opening in the die substrate 202 and plating or otherwise providing a suitable electrical conductor (e.g., gold) in the opening. A wet etching technique or a dry etching technique, both known to one of ordinary skill in the art, can be used to provide the opening of the via. For example, the opening may be etched using a deep reactive ion etching (DRIE) method such as the so-called "Bosch method."

A second electrode 208 is illustratively provided over an upper surface of the package substrate 201 with a second electrically insulating layer ("second insulating layer") 209 disposed thereover and contacting the first insulating layer 206. The second electrode 208 is a suitable electrical conductor such as a suitable metal or metal alloy and the second insulating layer 209 may be a deposited oxide (e.g., $SiO_2$) layer provided thereover by a known deposition method.

A voltage source 210 is electrically connected between the first electrode 205 and the second electrode 208 through an opening 211 in the second insulating layer 209. The voltage source 210 may be as described in connection with the transducer apparatus 100 above. The voltage source 210 may be configured to receive input signals from a controller (e.g., controller 104 not shown in FIG. 2) and to apply a voltage between the first electrode 205 and the second electrode 208. Alternatively, the voltage source may be a stand-alone device configured to apply a voltage between the first electrode 205 and the second electrode 208.

As described above, the applied voltage from the voltage source 210 may be a D.C. voltage, a periodic voltage and a non-periodic voltage. In all cases, the application of a voltage creates an electrostatic attractive force between the first electrode 205 and the second electrode 208. This electrostatic attractive force is sufficient to bond the die substrate 202 to the package substrate 201 during its application.

Application of a D.C. voltage by the voltage source 210 between the first electrode 205 and the second electrode 208 results in the substantially constant application of the electrostatic attractive force between the die substrate 202 and the package substrate 201. A substantially constant electrostatic attractive force results in the bonding of the die substrate 202 to the package substrate 201 without the use of an adhesive material (e.g., epoxy), which can result in deleterious induced stress in the transducer 203 as a result of curing. Beneficially, therefore, the application of a substantially constant electrostatic attractive force by the voltage source 210 eliminates one source of stress associated with bonding of the die substrate 202 to the package substrate 201.

Alternatively, the voltage source 210 may apply a periodic voltage between the first electrode 205 and the second electrode 208. Application of a periodic voltage by the voltage source 210 between the first electrode 205 and the second electrode 208 results in the application of a periodic electrostatic attractive force between the die substrate 202 and the package substrate 201. When the voltage is applied (e.g., "high voltage" or $V_{pulse}$ of FIG. 1), the electrostatic attractive force results in the bonding of the die substrate 202 to the package substrate 201 without the use of an adhesive material (e.g., epoxy), which can result in deleterious induced stress in the transducer 203 as a result of curing. When the voltage is not applied (e.g., "low voltage" or 0 Volts in FIG. 1), no electrostatic attractive force is provided and the die substrate 202 and the package substrate 201 are not bonded together. As such, stresses between the die substrate 202 and the package substrate 201 that result from external factors such as temperature can be relaxed by momentarily not bonding the die substrate 202 to the package substrate 201. The relaxation of stress between the die substrate 202 and the package substrate 201 results in a relaxation of stress imparted on the resonator. Beneficially, therefore, "built-up" stress from certain external factors can be periodically reduced, resulting in improved frequency characteristic and reliability of the transducer package 200 during use.

Still alternatively, the voltage source 210 may apply a non-periodic voltage between the first electrode 205 and the second electrode 208. Application of a non-periodic voltage by the voltage source 210 between the first electrode 205 and the second electrode 208 results in the application of a non-periodic electrostatic attractive force between the die substrate 202 and the package substrate 201. When the voltage is applied (e.g., "high voltage"), the electrostatic attractive force results in the bonding of the die substrate 202 to the package substrate 201 without the use of an adhesive material (e.g., epoxy), which can result in deleterious induced stress in the transducer 203 as a result of curing. When the voltage is not applied (e.g., "low voltage" or 0 Volts), no electrostatic attractive force is provided and the die substrate 202 and the package substrate 201 are not bonded together.

The application of a non-periodic voltage between the first electrode 205 and the second electrode 208 is contemplated for various operational scenarios. Illustratively, a non-periodic voltage may be applied between the first electrode 205 and the second electrode 208 as a result of feedback from a sensor (e.g., sensor 105 of FIG. 1). For example, if the sensed parameter (e.g., temperature, operating frequency, or strain across the membrane of the transducer 203) exceeds a threshold, the controller 104 can provide an input signal to the voltage source 210. In response to this input signal, the voltage source 210 does not apply a voltage between the first electrode 205 and the second electrode 208 for a predetermined period of time. As such, stresses between the die substrate 202 and the package substrate 201 that result from external factors such as temperature can be relaxed by momentarily not bonding the die substrate 202 to the package substrate 201. The relaxation of stress between the die substrate 202 and the package substrate 201 results in a relaxation of stress imparted on the transducer 203. Beneficially, therefore, "built-up" stress from certain external factors can be reduced when their impact has adversely impacted the operational performance and reliability of the transducer 203.

Figure 3:
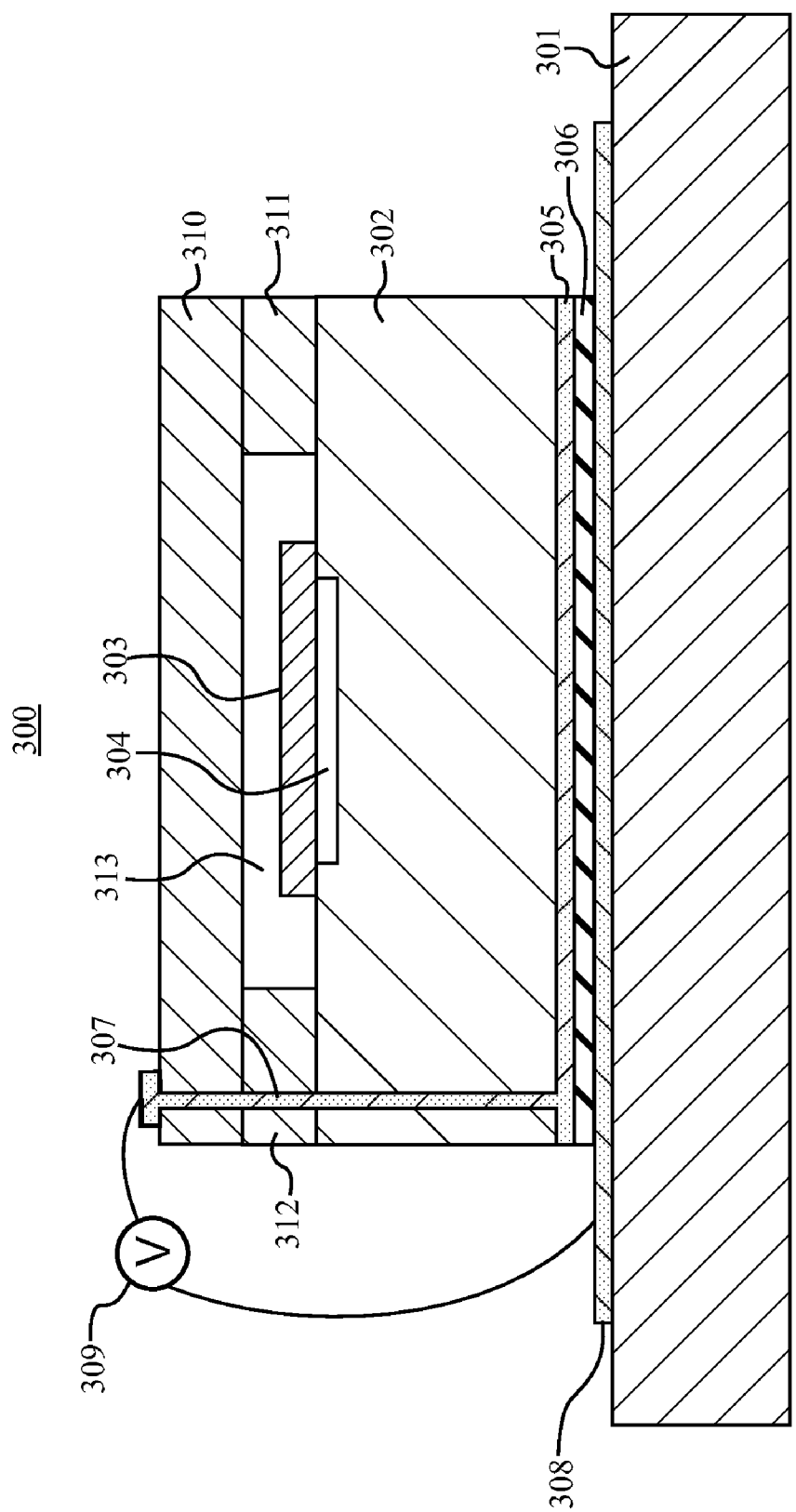
FIG. 3 is a cross-sectional diagram illustrating a transducer device disposed over a package substrate, according to a representative embodiment.

FIG. 3 is a cross-sectional diagram illustrating a transducer package 300 in accordance with a representative embodiment. The transducer package 300 may be implemented in the transducer apparatus 100 described above. The transducer package 300 comprises a package substrate 301 with a die substrate 302 disposed thereover. In a representative embodiment, the package substrate 301 comprises a plastic material suitable for the intended application of the transducer package 300. Alternatively, the package substrate 301 comprises a semiconductor material, such as such as silicon (Si), silicon germanium (SiGe), a Group III-V semiconductor (e.g., gallium arsenide (GaAs) or indium phosphide (InP), or variants thereof). The die substrate 202 comprises a semiconductor material, such as such as silicon (Si), silicon germanium (SiGe), a Group III-V semiconductor (e.g., gallium arsenide (GaAs) or indium phosphide (InP), or variants thereof). It is contemplated that the same semiconductor material is used for both the package substrate 301 and the die substrate 302 to provide, for example, materials having the same coefficient of thermal expansion.

A transducer 303 comprising membrane (not shown) and a resonator stack (not shown) is disposed over a cavity 304. The resonator stack comprises a first electrode (not shown), a piezoelectric layer (not shown) disposed over the first electrode, and a second electrode (not shown) disposed over the piezoelectric layer. Fabrication methods, materials and structures of the transducer 303 may be as described in the patents and patent applications in incorporated by reference above.

The die substrate 302 comprises a first electrode 305. The first electrode 305 is illustratively provided over a lower surface of the die substrate 302 with an electrically insulating layer ("insulating layer") 306 disposed thereover. The first electrode 305 is a suitable electrical conductor such as a suitable metal or metal alloy and the insulating layer 306 may be a deposited oxide (e.g., $SiO_2$) layer provided thereover by a known deposition method.

A conductive via ("via") 307 electrically contacts the first electrode 305 and extends through the die substrate 302 to an upper surface thereof. The via 307 may be formed by etching an opening in the die substrate 302 and plating or otherwise providing a suitable electrical conductor (e.g., gold) in the opening. A wet etching technique or a dry etching technique, both known to one of ordinary skill in the art, can be used to provide the opening of the via. For example, the opening may be etched using a deep reactive ion etching (DRIE) method such as the so-called "Bosch method."

A second electrode 308 is illustratively provided over an upper surface of the package substrate 301 with the insulating layer 306 disposed thereover and contacting the insulating layer 306.

A voltage source 309 is electrically connected between the first electrode 305 and the second electrode 308. The voltage source 309 may be as described in connection with the transducer apparatus 100 above. The voltage source 309 may be configured to receive input signals from a controller (e.g., controller 104 not shown in FIG. 3) and to apply a voltage between the first electrode 305 and the second electrode 308. Alternatively, the voltage source may be a stand-alone device configured to apply a voltage between the first electrode 305 and the second electrode 308.

The transducer package 300 comprises a cap 310 with a first support 311 and a second support 312. As shown, the via 307 extends through the second support 312 providing an electrical connection between the first electrode 305 and the voltage source 309. The cap 310 may be as described, for example, by RUBY, et al. in U.S. Pat. Nos. 6,228,675, 6,265, 646 and 6,429,511; and by GEEFAY, et al. in U.S. Pat. Nos. 6,787,897 and 6,979,597; all of which are hereby incorporated by reference. Notably, the teachings of these patents and patent applications are intended to be illustrative of methods, materials and structures useful to the present teachings, but in no way limiting to the present teachings.

As described above, the applied voltage from the voltage source 309 may be a D.C. voltage, a periodic voltage and a non-periodic voltage. In all cases, the application of a voltage creates an electrostatic attractive force between the first electrode 305 and the second electrode 308. This electrostatic attractive force is sufficient to bond the die substrate 302 to the package substrate 301 during its application. The selective bonding of the die substrate 302 to the package substrate 301 is effected through the application of a D.C. voltage by the voltage source 309, or through a periodic voltage by the voltage source 309, or through a non-periodic voltage by the voltage source 309. The applications and benefits of selectively bonding the die substrate 302 to the package substrate 301 by application of a D.C. voltage, or a periodic voltage, or a non-periodic voltage are substantially identical to those described above in connection with the representative embodiments of FIGS. 1 and 2.

Figure 4:
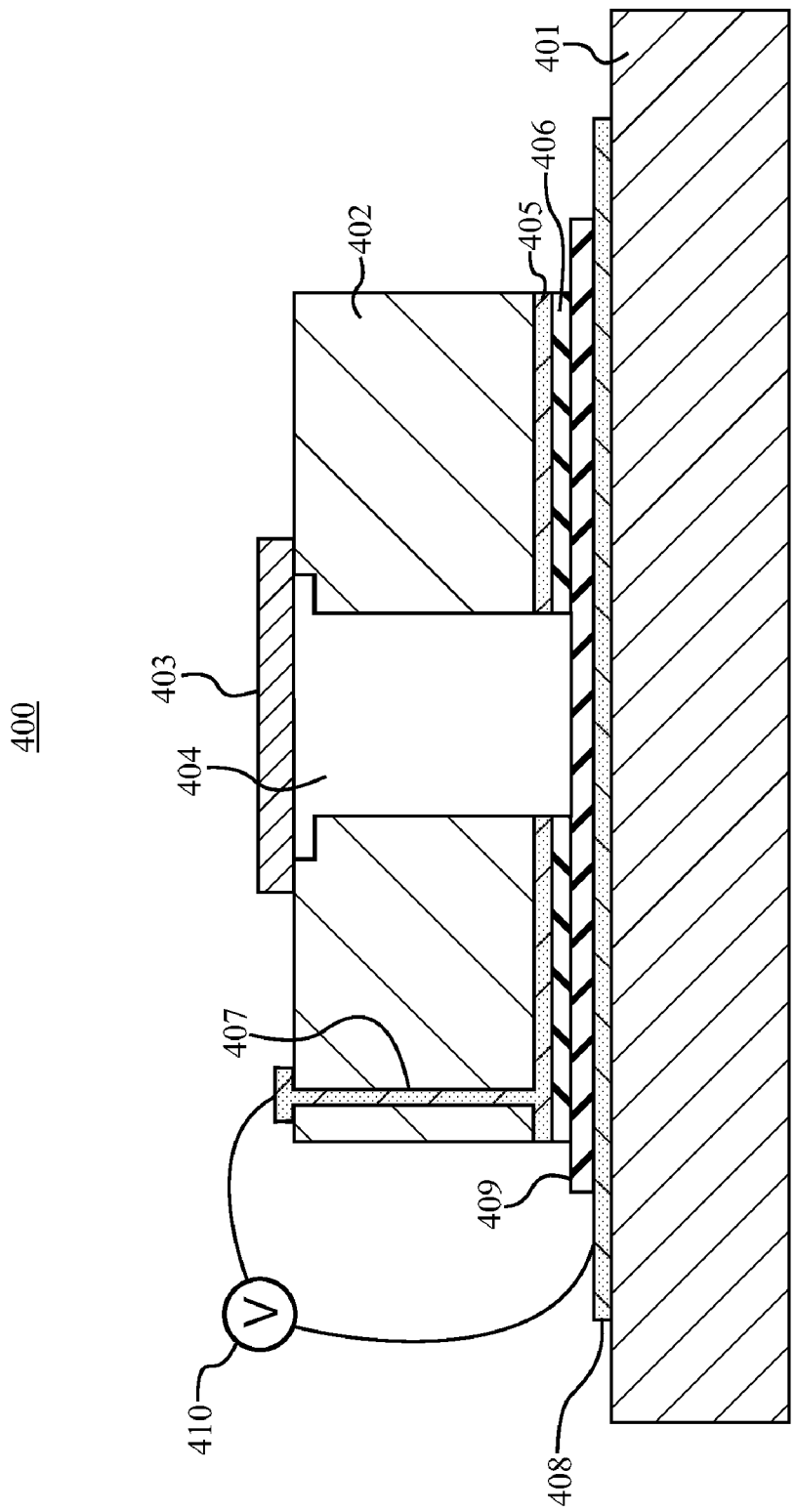
FIG. 4 a transducer device disposed over a package substrate, according to a representative embodiment.

FIG. 4 is a cross-sectional diagram illustrating a transducer package 400 in accordance with a representative embodiment. The transducer package 400 may be implemented in the transducer apparatus 100 described above. The transducer package 400 comprises a package substrate 401 with a die substrate 402 disposed thereover. In a representative embodiment, the package substrate 401 comprises a plastic material suitable for the intended application of the transducer package 400. Alternatively, the package substrate 401 comprises a semiconductor material, such as such as silicon (Si), silicon germanium (SiGe), a Group III-V semiconductor (e.g., gallium arsenide (GaAs) or indium phosphide (InP), or variants thereof). The die substrate 402 comprises a semiconductor material, such as such as silicon (Si), silicon germanium (SiGe), a Group III-V semiconductor (e.g., gallium arsenide (GaAs) or indium phosphide (InP), or variants thereof). It is contemplated that the same semiconductor material is used for both the package substrate 401 and the die substrate 402 to provide, for example, materials having the same coefficient of thermal expansion.

A transducer 403 comprising a membrane (not shown) and a resonator stack (not shown) is disposed over a cavity 404. The resonator stack comprises a first electrode (not shown), a piezoelectric layer (not shown) disposed over the first electrode, and a second electrode (not shown) disposed over the piezoelectric layer. Fabrication methods, materials and structures of the transducer 403 may be as described in the patents and patent applications in incorporated by reference above.

As depicted in FIG. 4, the cavity 404 extends through the die substrate 402. The cavity 404 may be fabricated through a wet etch process, or a dry etch process (e.g., the Bosch method), or a combination thereof. Further details of the formation of the cavity 404 and the resonator stack disposed thereover are disclosed by MARTIN, et al. in the above-referenced patent application, and by MARTIN, et al. in U.S. patent application Ser. No. 12/879,685, which is incorporated herein by reference. Notably, a "vent" (not shown) may be provided to equalize pressure.

The die substrate 402 comprises a first electrode 405. The first electrode 405 is illustratively provided over a lower surface of the die substrate 402 with a first electrically insulating layer 406 disposed thereover. The first electrode 405 is a suitable electrical conductor such as a suitable metal or metal alloy and the insulating layer 306 may be a deposited oxide (e.g., $SiO_2$) layer provided thereover by a known deposition method.

A conductive via ("via") 407 electrically contacts the first electrode 405 and extends through the die substrate 402 to an upper surface thereof. The via 407 may be formed by etching an opening in the die substrate 402 and plating or otherwise providing a suitable electrical conductor (e.g., gold) in the opening. A wet etching technique or a dry etching technique, both known to one of ordinary skill in the art, can be used to provide the opening of the via. For example, the opening may be etched using a deep reactive ion etching (DRIE) method such as the so-called "Bosch method."

A second electrode 408 is illustratively provided over an upper surface of the package substrate 401 with a second electrically insulating layer 409 disposed thereover. Notably, a single insulating layer may be provided between the first electrode 405 and the second electrode 408.

A voltage source 410 is electrically connected between the first electrode 405 and the second electrode 408. The voltage source 410 may be as described in connection with the transducer apparatus 100 above. The voltage source 410 may be configured to receive input signals from a controller (e.g., controller 104 not shown in FIG. 4) and to apply a voltage between the first electrode 405 and the second electrode 408. Alternatively, the voltage source may be a stand-alone device configured to apply a voltage between the first electrode 405 and the second electrode 408.

As described above, the applied voltage from the voltage source 410 may be a D.C. voltage, a periodic voltage and a non-periodic voltage. In all cases, the application of a voltage creates an electrostatic attractive force between the first electrode 405 and the second electrode 408. This electrostatic attractive force is sufficient to bond the die substrate 402 to the package substrate 401 during its application. The selective bonding of the die substrate 402 to the package substrate 401 is effected through the application of a D.C. voltage by the voltage source 410, or through a periodic voltage by the voltage source 410, or through a non-periodic voltage by the voltage source 410. The applications and benefits of selectively bonding the die substrate 402 to the package substrate 401 by application of a D.C. voltage, or a periodic voltage, or a non-periodic voltage are substantially identical to those described above in connection with the representative embodiments of FIGS. 1-3.

Figure 5:
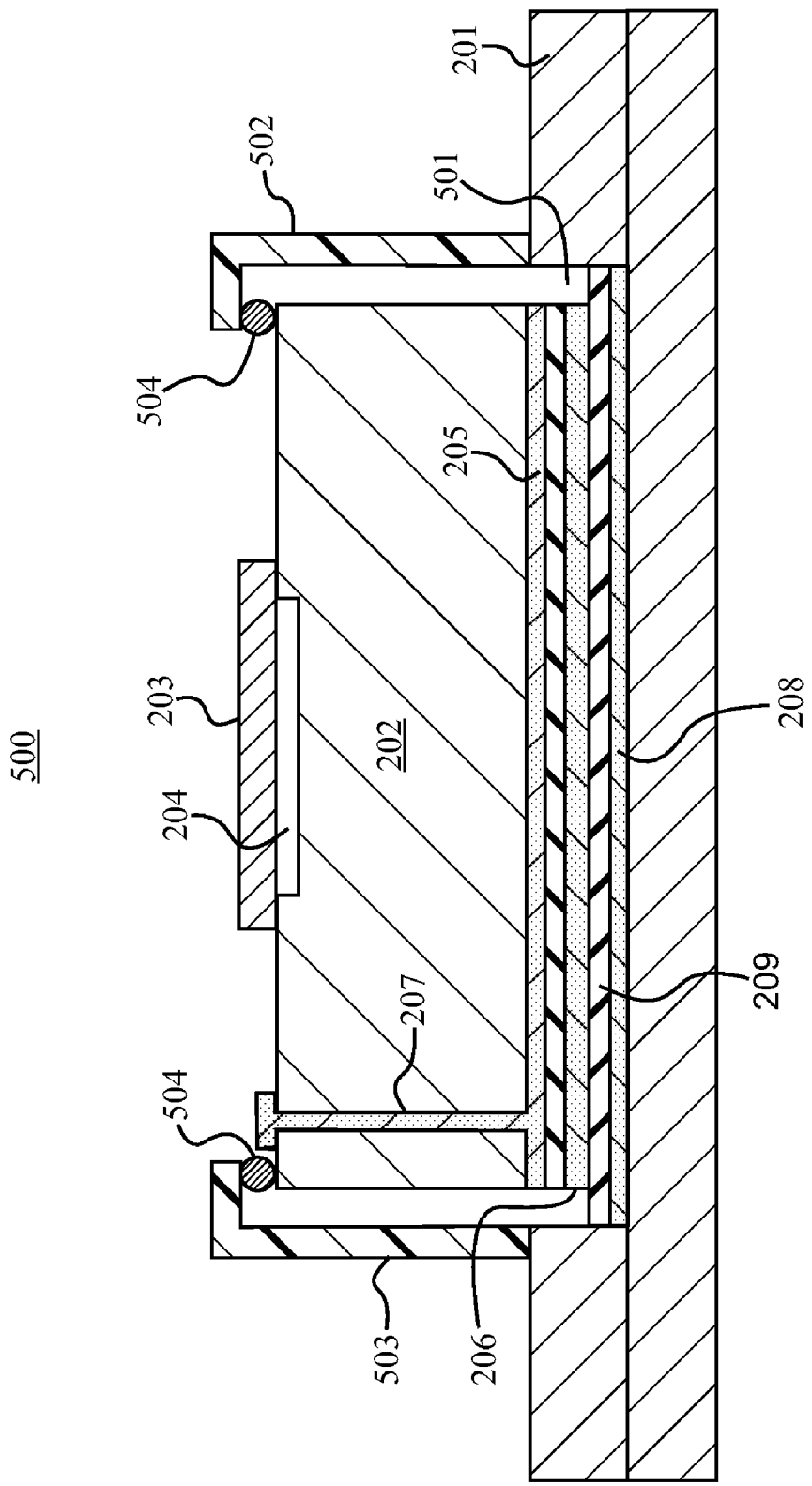
FIG. 5 is a cross-sectional diagram illustrating a transducer device disposed over a package substrate, according to a representative embodiment.

FIG. 5 is a cross-sectional diagram illustrating a transducer package 500 in accordance with a representative embodiment. As can be appreciated from a review of FIG. 5 certain aspects of the transducer package 500 are common to those described above in connection with transducer package 200 of the representative embodiments of FIG. 2. Many of the details that are common to the transducer package 200 are not repeated in order to avoid obscuring the presently described embodiments.

The package substrate 201 comprises a recess 501 configured to receive the die substrate 202. Recess 501 is provided to a depth of approximately one-half the height of the die substrate 202 and a width that is slightly greater than the width of the die substrate 202. It is noted that the recess 501 is optional.

The transducer package 500 comprises a first post 502 and a second post 503. The first and second posts 502, 503 comprise a molded plastic, for example. The contact pads 504 illustratively comprise a plastic, polyurethane or gold. The first and second posts 502,503 contact pads 504, and through this contact maintain the die substrate 202 in the recess 501. A wirebond (not shown) may be used to provide an electrical connection between the via 207 and the second electrode 208.

A voltage source (not shown in FIG. 5) is electrically connected between the first electrode 205 and the second electrode 208. The voltage source may be as described in connection with the transducer apparatus 100 above. The voltage source may be configured to receive input signals from a controller (e.g., controller 104 not shown in FIG. 5) and to apply a voltage between the first electrode 205 and the second electrode 208. Alternatively, the voltage source may be a stand-alone device configured to apply a voltage between the first electrode 205 and the second electrode 208.

As described above, the applied voltage from the voltage source may be a D.C. voltage, a periodic voltage and a non-periodic voltage. In all cases, the application of a voltage creates an electrostatic attractive force between the first electrode 205 and the second electrode 208. This electrostatic attractive force is sufficient to bond the die substrate 202 to the package substrate 201 during its application. The selective bonding of the die substrate 202 to the package substrate 201 is effected through the application of a D.C. voltage by a voltage source (not shown in FIG. 5) such as described above, or through a periodic voltage by the voltage source, or through a non-periodic voltage by the voltage source. The applications and benefits of selectively bonding the die substrate 202 to the package substrate 201 by application of a D.C. voltage, or a periodic voltage, or a non-periodic voltage are substantially identical to those described above in connection with the representative embodiments of FIGS. 1-4.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A transducer apparatus, comprising:
   a package substrate;
   a transducer disposed over a die substrate, wherein the die substrate is disposed over the package substrate; and
   a voltage source connected between the die substrate and the package substrate, and configured to selectively apply an electrostatic attractive force between the die substrate and the package substrate.

2. A transducer apparatus as claimed in claim 1, wherein the voltage source is configured to provide a time dependent voltage.

3. A transducer apparatus as claimed in claim 2, wherein the time dependent voltage is a square wave voltage.

4. A transducer apparatus as claimed in claim 1, wherein the voltage source is configured to provide a substantially constant voltage.

5. A transducer apparatus as claimed in claim 1, further comprising a controller configured to provide input signals to the voltage source, wherein the input signals are configured to selectively change a voltage provided by the voltage source.

6. A transducer apparatus as claimed in claim 5, further comprising a sensor configured to measure an operating frequency of the transducer and to provide a signal indicative of the measured operating frequency to the controller.

7. A transducer apparatus as claimed in claim 6, wherein the controller, based on the signal from the sensor, is configured to provide an input signal to the controller to terminate the electrostatic attractive force.

8. A transducer apparatus as claimed in claim 1, wherein the transducer comprises a micro-electromechanical systems (MEMS) transducer.

9. A transducer apparatus as claimed in claim 8, wherein the MEMS transducer comprises a piezoelectric micro-electromechanical ultrasonic transducer (PMUT).

* * * * *